United States Patent [19]
Hattori

[11] Patent Number: 5,705,952
[45] Date of Patent: Jan. 6, 1998

[54] OPERATIONAL AMPLIFIER CIRCUIT

[75] Inventor: Takahiro Hattori, Tokyo, Japan

[73] Assignee: NEC Corporation, Tokyo, Japan

[21] Appl. No.: 705,167

[22] Filed: Aug. 29, 1996

[30]  Foreign Application Priority Data

Aug. 30, 1995  [JP]  Japan .................................. 7-222397

[51] Int. Cl.$^6$ .................. H03F 3/30; H03F 3/45
[52] U.S. Cl. ........................ 330/255; 330/257; 330/267
[58] Field of Search ................................. 330/255, 257, 330/267, 273

[56]  References Cited

U.S. PATENT DOCUMENTS 5,166,636  11/1992  Bien ........................................ 330/255

FOREIGN PATENT DOCUMENTS 1141407  6/1989  Japan .
1278108  11/1989  Japan .

Primary Examiner—James B. Mullins
Attorney, Agent, or Firm—Whitham, Curtis, Whitham & McGinn

[57]  ABSTRACT

The present invention provides an operational amplifier circuit which comprises an input circuit for outputting a difference between first and second input voltages, an amplifier circuit for amplifying the difference, a drive circuit for driving a latter stage in response to output from the amplifier circuit and an output circuit which constitutes the latter stage, wherein the amplifying circuit has a serial circuit composed of a first constant current source and a first transistor and a serial circuit composed of a second constant current source and a second transistor, the emitter of the first transistor is connected to the base of the second transistor, and the difference is applied to the base of the first transistor; the drive circuit has a serial circuit composed of third and fourth transistors whose collectors and emitters are interconnected and a third constant current source, the base and collector of the fourth transistor are interconnected, and the base of the third transistor is connected to the emitter of the second transistor; and the output circuit receives inputs from the collector of the second transistor and the base of the fourth transistor.

3 Claims, 5 Drawing Sheets

OPERATIONAL AMPLIFIER CIRCUIT

BACKGROUND OF THE INVENTION

1. Field of the Invention

This invention relates to an operational amplifier circuit and, particularly, to a differential amplifier circuit having an expanded amplitude of the maximum output voltage.

2. Description of the Prior Art

Referring to the circuit diagram of FIG. 1A which shows an operational amplifier circuit of a first prior art, in this circuit, an input stage 4 comprises a pair of PNP type transistors Q1 and Q2 constituting a differential pair, a pair of NPN type transistors Q5 and Q6 constituting a current mirror circuit as an active load and a constant current source I1 for supplying a bias current, an amplifying stage 41 comprises NPN type transistors Q13 and Q14 connected to two stages, a resistor R for determining a collector current of the transistor Q13, diodes D1 and D2 connected in series for level shift, and a constant current source I3 for supplying a bias current, and an output stage 42 is formed by connecting an NPN type transistor Q11 and a PNP type transistor Q12 in series.

A first input terminal 5 is connected to the base of the transistor Q1, a second input terminal 6 is connected to the base of the transistor Q2, and input voltages VIN1 and VIN2 which are independent from each other are applied to the first input terminal 5 and the second input terminal 6, respectively.

To the input stage 40, the amplifying stage 41 and the output stage 42 are connected a high-potential V (+) power terminal 7 and a low-potential (−) power terminal 9. An output terminal 8 of output voltage Vout is connected to the common connection point of the emitters of the transistors Q11 and Q12.

The minimum input application potential VIN at which this circuit is operable is obtained from the following equation.

$$VIN = V(-) - VBE(Q2) + VCE(sat)(Q2) + VBE(Q5) + VBE(Q6) = V(-) + VBE + VCE(sat)$$

In this equation, VBE (Q2) represents a voltage between the base and emitter of the transistor Q2. VCE (sat) (Q2) represents a saturation voltage between the collector and emitter of the transistor Q2. VBE (Q5) and VBE (Q6) represent a voltage between the base and emitter of the transistors Q5 and a voltage between the base and emitter of the transistor Q6, respectively.

Since VBE is about 0.6 V and VCE (sat) is about 0.2 V, the above VIN is (V (−) +0.8 [V]) which is the minimum potential that can be input.

Referring to the circuit diagram of FIG. 2A which shows an operational amplifier circuit of a second prior art, in this circuit, an input stage 50 comprises pairs of PNP type transistors Q1 and Q2, and Q3 and Q4 constituting multiple differential pairs, NPN type transistors Q5 and Q6 constituting a current mirror circuit as an active load and a constant current source I1 for supplying a bias current, an amplifying stage 51 comprises a PNP type transistor Q7, NPN type transistors Q8 and Q9 and constant current sources I2 and I3 for supplying a bias current, and an output stage 52 comprises NPN type transistors Q15 and Q11, a PNP type transistor Q12 and a constant current source I4 for supplying a bias current.

The minimum input application potential VIN at which this circuit is operable is obtained from the following equation.

$$VIN = V(-) - VBE(Q2) - VBE(Q4) + VCC(sat)(Q4) - VBE(Q7) + VBE(Q8) + VBE(Q9) = V(-) + VBE + VCE(sat) = V(-) - 0.4[v]$$

As described above, since the minimum input application potential VIN of the input stage 40 shown in FIG. 1A is 1.2 V larger than that of the input stage 50 shown in FIG. 2A, it is found that the input stage 50 is more advantageous over the input stage 40.

FIGS. 1B and 2B which show the waveforms of output voltages VOUT in the output stage 42 of FIG. 1A and the output stage 52 of FIG. 2A, respectively, are now referred to.

In the output stage 42 of FIG. 1A, the potential which is larger than the low potential V (−) by the total voltage of VCE (sat) of the transistor Q14 and VBE of the transistor Q12 is the minimum potential Vmini for normal operation. Meanwhile, the maximum potential Vmax for normal operation is the potential which is smaller than the high potential V (+) by the total voltage of VBE of the transistor Q11 and VCE (sat) of the transistor constituting the constant current source I3 and is represented by an output waveform shown in FIG. 1B.

In the output stage 52 of FIG. 2A, though its low potential V (−) side is the same as that of FIG. 1A, the transistors Q15 and Q11 are Darlington connected on the high potential V (+) side. Therefore, the potential is reduced by the total voltage of 2 times VBE and VCE (sat) of the transistor constituting the constant current source I3 and is represented by an output waveform shown in FIG. 2B.

It is found from above that the amplitude of the maximum output voltage is 0.6 V larger in FIG. 1A than FIG. 2A.

As a third prior art for further expanding the amplitude of the maximum output voltage, referring to the circuit diagram of FIG. 3 shown in JP-A 141407/1989, this circuit has an amplifying stage and an output stage, a drive transistor 22, diodes 23 and 24, and a constant current load transistor 21 are connected in series, output transistors 25 and 26 whose emitters are interconnected, the bases of these transistors 25 and 26 are connected to both ends of a serial connection of the diodes 23 and 24, and the interconnected emitters are biased by potential dividing resistors 11 and 12. To the input of a current mirror circuit which is formed by a resistor 13, transistors 27 and 29, and a constant current source is connected the collector of the transistor 25 and to the output thereof is connected an output terminal 8. To the input of a current mirror circuit which is formed by a resistor 14, transistors 28 and 10 and a constant current source 16 is connected the collector of the transistor 26 and to the output thereof is connected an output terminal 8.

Since the potential is reduced and increased by the voltage of VCE (sat) of the transistor 29 and the voltage of VCE (sat) of the transistor 10, respectively, it is found that the maximum voltage amplitude of this circuit is expanded by 1.2 V compared with the case of FIG. 1A.

That is, it is found that the transistors of the output stage are preferably of a common emitter type.

However, the total number of elements constituting the amplifying stage and the output stage is 16 which is is larger than 8 of FIG. 1A and 8 of FIG. 2A, thereby preventing high integration. This type of operational amplifier is such that many elements are formed on a single semiconductor substrate with the same configuration in most cases. This prevents high integration significantly and also prevents high reliability from being secured.

Further, since the current mirror circuit functions to discharge and suck a current in the output stage, this prior art has such a defect that a current higher than the current running through this current mirror circuit cannot be driven.

Moreover, it is preferred to reduce power consumption by enabling the circuit of the amplifying stage to be driven with a low current. To this end, it is important to reduce the number of constituent elements and not to use a common base type transistor or the like.

In view of the above findings and problems, objects of the present invention are as follows.

(1) To expand the range of input application voltage at which normal operation is possible,
(2) to expand the amplitude of the maximum output voltage,
(3) to reduce the number of constituent elements and power consumption of the amplifying stage, in particular,
(4) to expand the range of drive current of the output stage, and
(5) to achieve circuit configuration suitable for high integration.

SUMMARY OF THE INVENTION

To attain the above objects, according to an embodiment of the present invention, there is provided an operational amplifier circuit comprising an input circuit for outputting a difference between first and second input voltages, an amplifier circuit for amplifying the difference, a drive circuit for driving a latter stage in response to output from the amplifier circuit, and an output circuit which constitutes the latter stage, wherein the amplifying circuit has a serial circuit composed of a first constant current source and a first transistor and a serial circuit composed of a second constant current source and a second transistor, the emitter of the first transistor is connected to the base of the second transistor, and the difference is applied to the base of the first transistor;

the drive circuit has a serial circuit composed of third and fourth transistors whose collectors and emitters are interconnected and a third constant current source, the base and collector of the fourth transistor are interconnected, and the base of the third transistor is connected to the emitter of the second transistor; and the output circuit receives inputs from the collector of the second transistor and the base of the fourth transistor.

The output circuit of the above embodiment is composed of a pair of reverse-conducting transistors whose emitters are connected to the constant potential sources and whose collectors are interconnected and the inputs of the previous stage are applied to the bases of these transistors.

The input circuit of the above embodiment is composed of fifth and sixth transistors whose emitters are connected in common to a fourth constant current source, a current mirror circuit connected between the collectors of the fifth and sixth transistors and a low-potential source, a seventh transistor whose base is connected to the first input voltage, whose emitter is connected to the base of the fifth transistor and whose collector is connected to the low potential source, and an eighth transistor whose base is connected to the second input voltage, whose emitter is connected to the base of the sixth transistor and whose collector is connected to the low-potential source.

According to the present invention, the amplifier circuit can receive a large input application voltage, and signals for driving the output circuit are at a suitable level for driving the output circuit because they are supplied from the amplifier circuit and the drive circuit independently. Particularly when the output circuit is formed of common emitter type transistors whose collectors are interconnected, the amplitude of the maximum output voltage can be expanded, input application voltage at which normal operation is possible can also be expanded, and power consumption can be reduced by reducing the number of constituent elements.

The above and many other advantages, features and additional objects of the present invention will become manifest to those versed in the art upon making reference to the following detailed description and accompanying drawings in which preferred embodiments incorporating the principles of the present invention are shown by way of illustrative example.

DETAILED DESCRIPTION OF THE PREFERRED EMBODIMENTS

Preferred embodiments of the present invention will be described hereinunder with reference to the accompanying drawings.

Figure 4A:
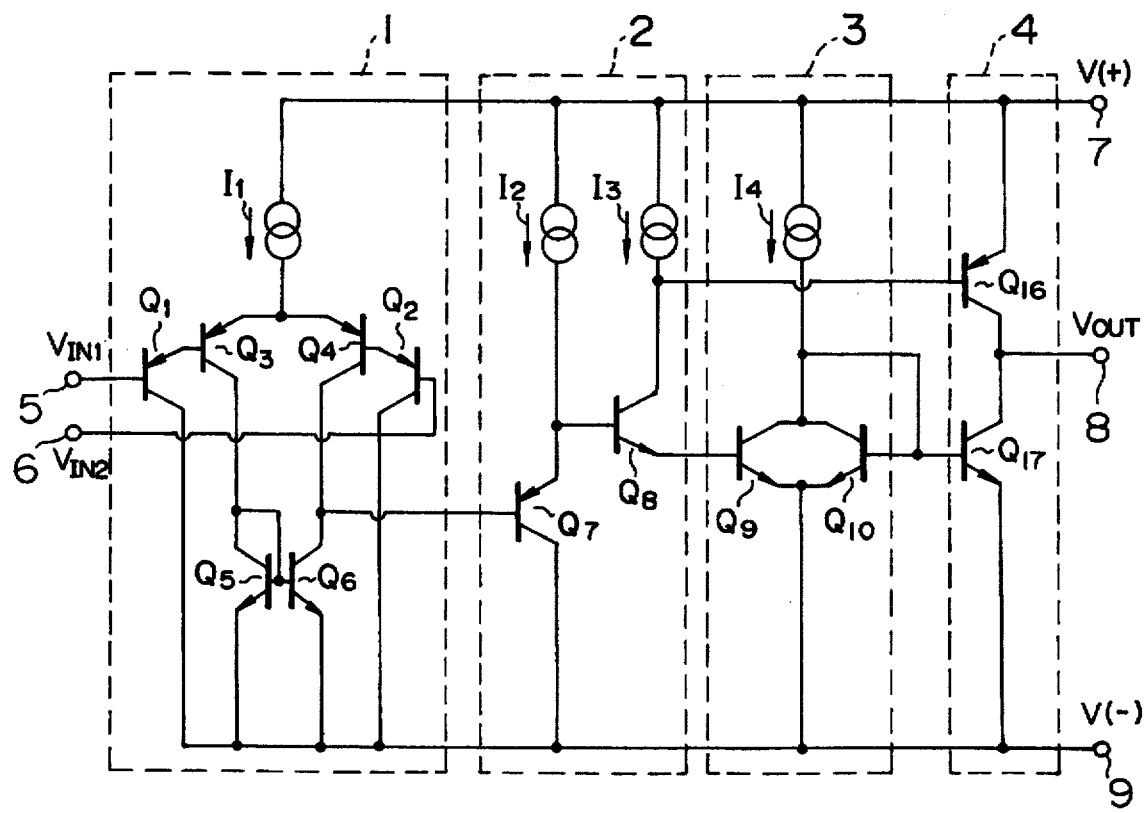
FIG. 4A is a circuit diagram showing a first embodiment of the present invention.

Referring to the circuit diagram of FIG. 4A which shows a first embodiment of the present invention, this embodiment is a circuit formed by connecting an input circuit 1, an amplifier circuit 2, a drive circuit 3 and an output circuit 4 in the order named.

The input circuit 1 comprises a differential pair consisting of PNP type transistors Q3 and Q4 whose emitters are interconnected, a current mirror circuit formed by NPN type transistors Q5 and Q6 connected between the collectors of the transistors Q3 and Q4 and a low-potential V (−) power source terminal 9, a PNP type transistor Q1 whose base is connected to a first input terminal 5, whose emitter is connected to the base of the transistor Q3 and whose collector is connected to the terminal 9, and a constant current source I1 connected between a high-potential (+) power source terminal 7 and the interconnected emitters. The collector and base of the transistor Q5 are interconnected.

The amplifier circuit 2 comprises constant current sources I2 and I3 connected to the terminal 7, a PNP type transistor Q7 whose emitter is connected to the constant current source I2, whose collector is connected to the terminal 9 and whose base is connected to the collector of the transistor Q6, and an NPN type transistor Q8 whose collector is connected to the constant current source I3 and whose base is connected to the emitter of the transistor Q7.

The drive circuit 3 comprises a constant current source I4 connected to the terminal 7 and NPN type transistors Q9 and Q10 whose collectors are connected in common to the constant current source I4 and whose emitters are connected in common to the terminal 9. The base and collector of the transistor Q10 are interconnected. The base of the transistor Q9 is connected to the emitter of the transistor Q8.

In the output circuit 4, the collectors of a PNP type transistor Q16 and an NPN type transistor Q17 are connected in common to the output terminal 8, the base of the transistor Q16 is connected to the collector of the transistor Q8, the base of the transistor Q17 is connected to the base of the transistor Q10, the emitter of the transistor Q16 is connected to the terminal 7, and the emitter of the transistor Q17 is connected to the terminal 9.

To the above circuits 1 to 4 is applied power voltage from the terminals 7 and 9.

Since the output circuit 4 uses common emitter type transistors Q16 and Q17 whose collectors are interconnected, a reduction in the amplitude of output voltage is the voltage of VCE (sat) at upper and lower ends.

Figure 1A:
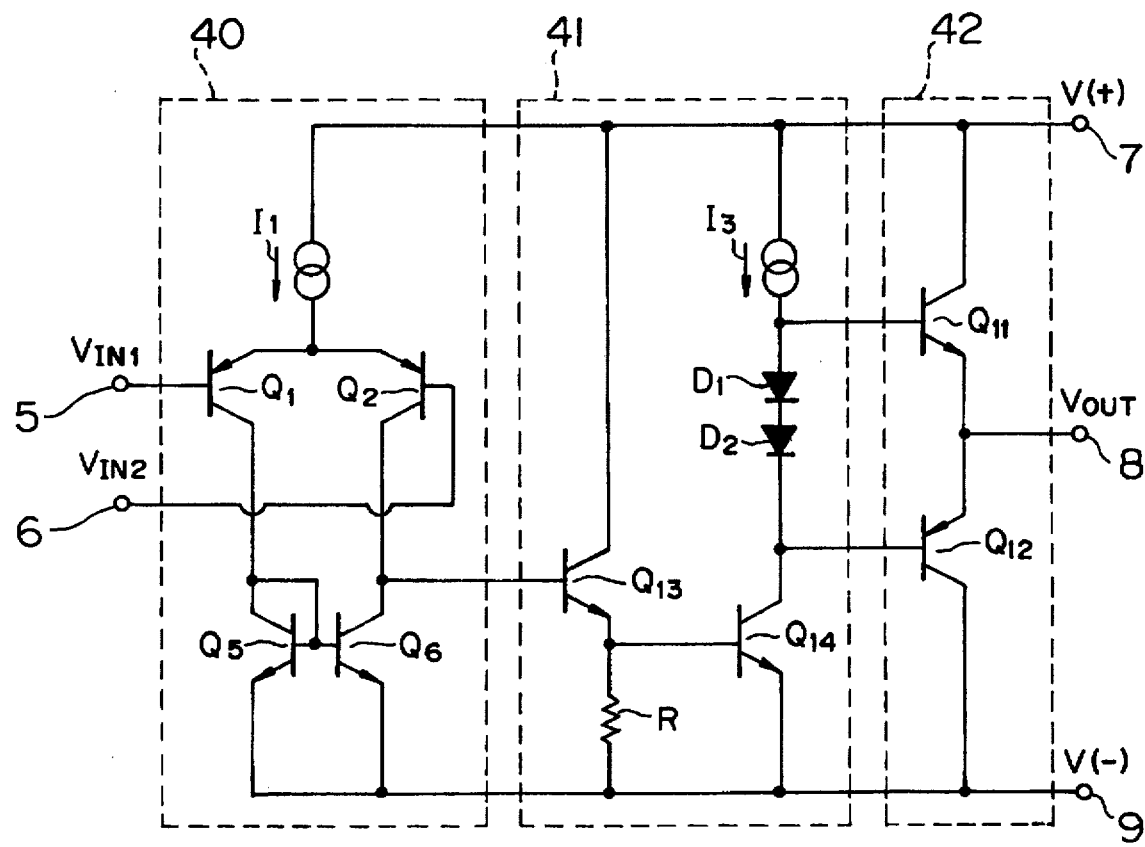
FIG. 1A is a circuit diagram showing an arithmetic circuit of a first prior art.
Figure 1B:
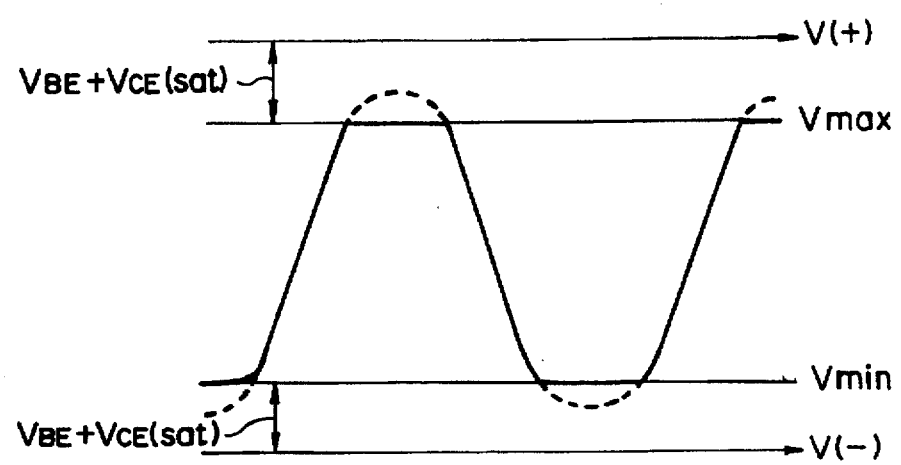
FIG. 1B shows a waveform indicating the operation of the first prior art shown in FIG. 1A.
Figure 2A:
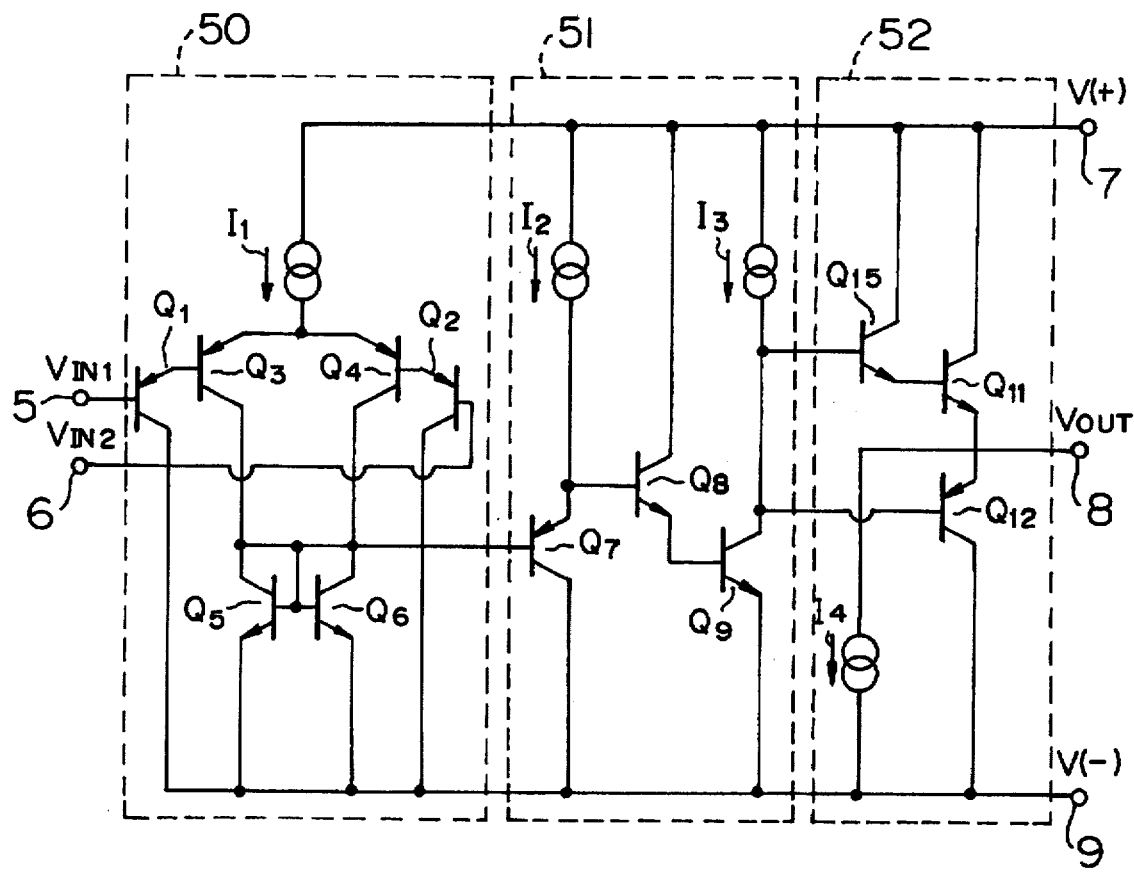
FIG. 2A is a circuit diagram showing an arithmetic circuit of a second prior art.
Figure 2B:
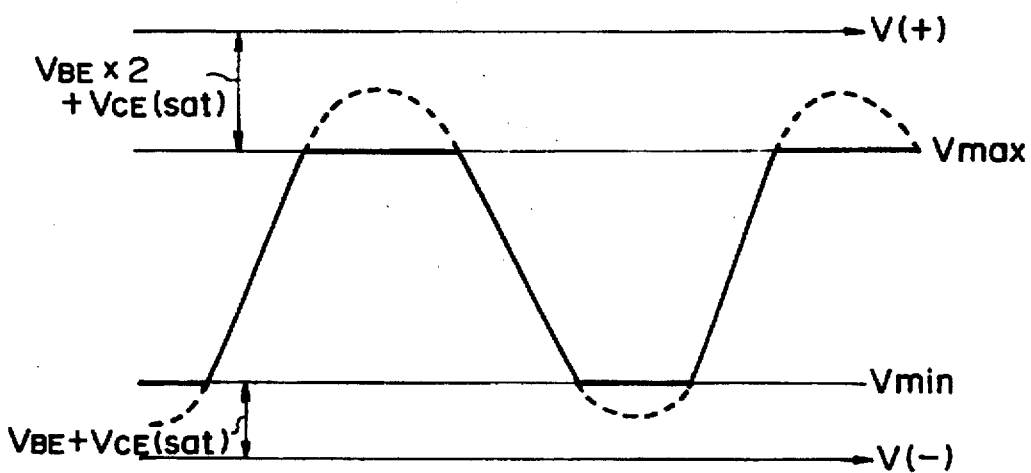
FIG. 2B shows a waveform indicating the operation of the second prior art shown in FIG. 2A.
Figure 3:
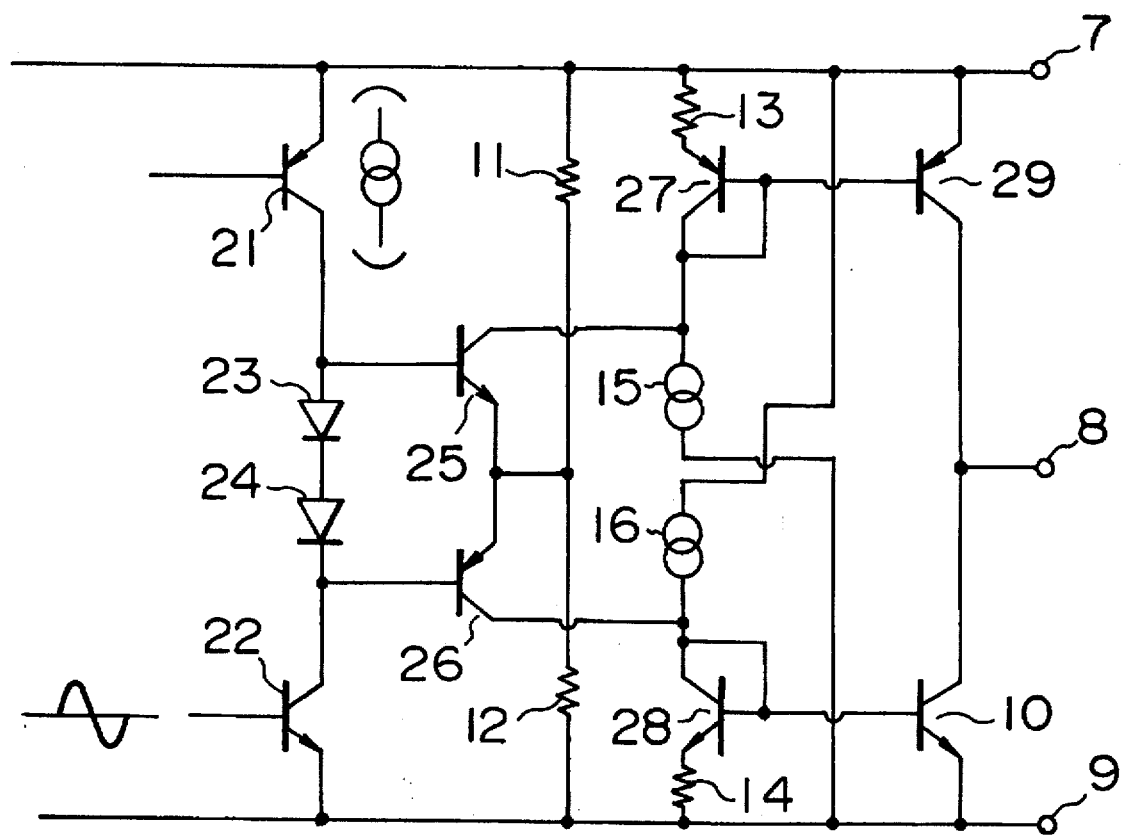
FIG. 3 is a circuit diagram showing an arithmetic circuit of a third prior art.

Input application voltage at which the input circuit 1 can operate properly is about [V (−)−0.4]V which is the same as in FIG. 2A.

In this respect, due to a combination of the transistors Q7, Q8 and Q9 and the transistors Q2 and Q4 of the input circuit 1, operable input application voltage on the V (−) side is the same as in the prior art of FIG. 2A.

The base of the transistor Q16 is connected to the collector of the transistor Q8, the base of the transistor Q17 is connected to the base of the transistor Q10 whose base and collector are interconnected, the collectors of the transistors Q9 and Q10 are connected to the constant current source I4 and emitters thereof are connected to negative power voltage. The base of the transistor Q9 is connected to the emitter of the transistor Q8. This circuit configuration is intended to obtain the same phase by inverting the phase by taking signals from the collector and emitter of the transistor Q8. Due to this configuration, in the first embodiment comprising the output circuit 4, since the transistors Q1 and Q17 of the output circuit 4 operates up to VCE (sat), output voltage ranging from V (−)−VCE (sat) (Q12) to V (+)−VCE (sat) (Q12) can be obtained.

In addition, the base of the transistor Q16 of the output circuit 4 is controlled by the amplifier circuit 2, and the base of the transistor Q17 is controlled by the drive circuit 3. That is, the discharge side and the suction side of the output current function independently from each other.

Figure 4B:
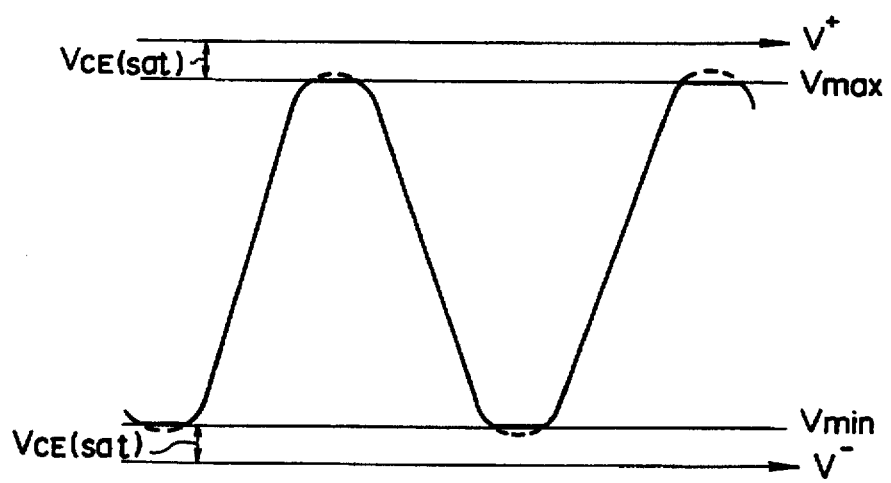
FIG. 4B shows a waveform indicating the operation of the first embodiment shown in FIG. 4A.

With reference to the waveform diagram of FIG. 4B which shows the output voltage of the first embodiment, both the minimum potential Vmini and the maximum potential Vmax for normal operation are clipped by about 0.2 V, output voltage having almost the same amplitude as that of power voltage can be obtained.

In the first embodiment, the transistors Q1, Q2, Q3, Q4, Q7 and Q16 are formed of PNP type bipolar transistors and the transistors Q5, Q6, Q8, Q9, Q10 and Q18 are formed of NPN type bipolar transistors. There is a second embodiment in which these transistors are formed of reverse-conducting bipolar transistors.

Figure 5:
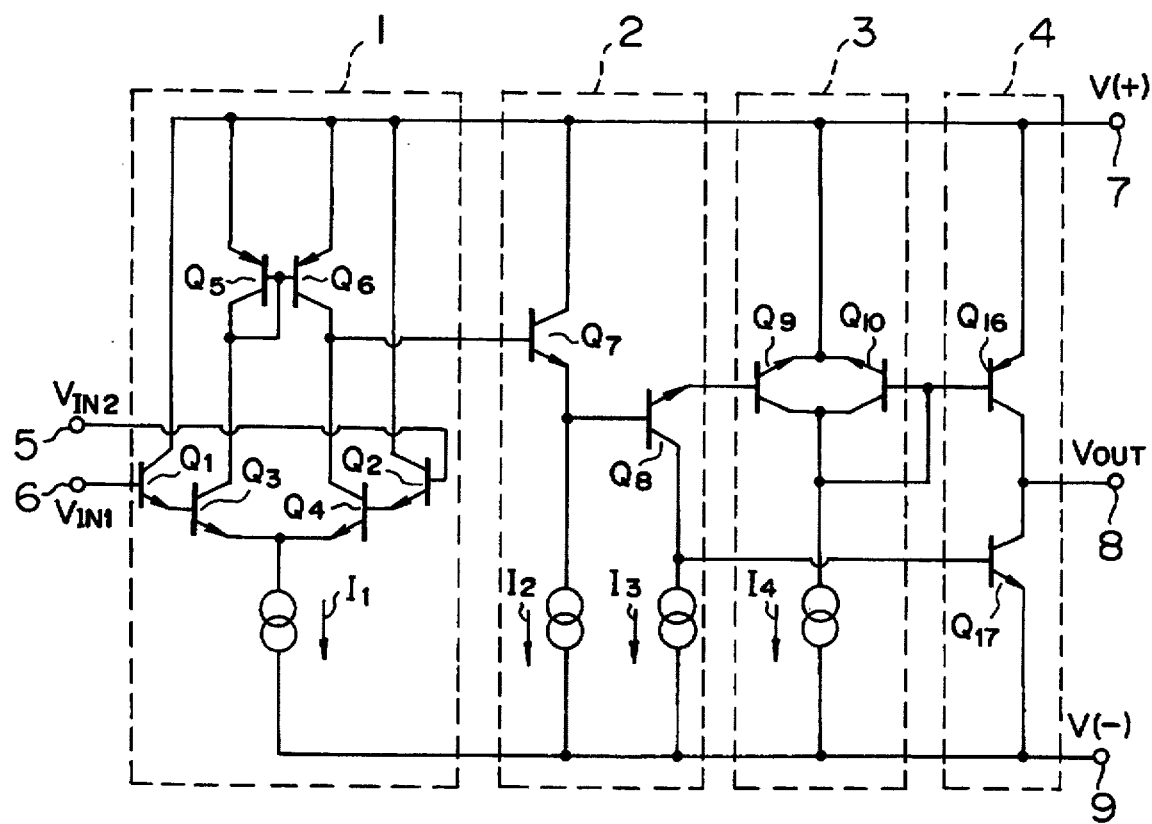
FIG. 5 is a circuit diagram showing a second embodiment of the present invention.

With reference to the circuit diagram of FIG. 5 which shows the second embodiment, transistors Q1, Q2, Q3, Q4, Q7 and Q16 are formed of NPN type bipolar transistors and other transistors are formed of PNP bipolar transistors, and their connections are changed accordingly. Since the circuit operation and effect are the same as in the above first embodiment, they are only represented by the same Arabic numerals and alphabets and their descriptions are omitted.

According to the above first and second embodiments, the number of elements of the amplifier circuit is four and that of the drive circuit is three, which are about half those of the third prior art, whereby a relatively large current does not need to be applied and hence, power consumption can be reduced due to a small number of constituent elements.

As described on the foregoing pages, according to the present invention, the output circuit is of a common emitter type whose collectors are interconnected, the input circuit is constituted in multiple stages, and the amplifier circuit and the drive circuit are adapted to the constitution of the input circuit. Therefore, a circuit in which operable input application voltage is lower than a low-potential power voltage and the maximum output voltage is increased can be obtained. All the above effects can be attained.

What is claimed is:

1. An operational amplifier circuit comprising an input circuit for outputting a difference between first and second input voltages, an amplifier circuit for amplifying the difference, a drive circuit for driving a latter stage in response to output from the amplifier circuit and an output circuit which constitutes the latter stage, wherein the amplifying circuit has a serial circuit composed of a first constant current source and a first transistor and a serial circuit composed of a second constant current source and a second transistor, the emitter of the first transistor is connected to the base of the second transistor, and the difference is applied to the base of the first transistor;

the drive circuit has a serial circuit composed of third and fourth transistors whose collectors and emitters are interconnected and a third constant current source, the base and collector of the fourth transistor are interconnected, and the base of the third transistor is connected to the emitter of the second transistor; and the output circuit receives inputs from the collector of the second transistor and the base of the fourth transistor.

2. An operational amplifier circuit according to claim 1, wherein the output circuit is composed of a pair of reverse-conducting transistors whose emitters are connected to constant potential sources, whose collectors are interconnected, and whose bases are applied the inputs of the previous stages.

3. An operational amplifier circuit according to claim 1, wherein the input circuit has fifth and sixth transistors whose emitters are connected in common to a fourth constant current source, a current mirror circuit connected between the collectors of the fifth and sixth transistors and a low-potential source, a seventh transistor whose base is connected to the first input voltage, whose emitter is connected to the base of the fifth transistor and whose collector is connected to the low-potential source, and an eighth transistor whose base is connected to the second input voltage, whose emitter is connected to the base of the sixth transistor and whose collector is connected to the low-potential source.

* * * * *